(12) United States Patent
Liou et al.

(10) Patent No.: US 7,372,516 B2
(45) Date of Patent: May 13, 2008

(54) LIQUID CRYSTAL DISPLAY WITH A PERFUME DISPENSER

(75) Inventors: Guan-De Liou, Taipei (TW); I-Cheng Lo, Wurih Township, Taichung County (TW)

(73) Assignee: Hannspree, Inc., Taipei (TW)

( * ) Notice: Subject to any disclaimer, the term of this patent is extended or adjusted under 35 U.S.C. 154(b) by 344 days.

(21) Appl. No.: 11/091,436

(22) Filed: Mar. 29, 2005

(65) Prior Publication Data

US 2006/0132669 A1   Jun. 22, 2006

(30) Foreign Application Priority Data

Dec. 22, 2004   (TW) .............................. 93220686 U

(51) Int. Cl.
*G02F 1/1333* (2006.01)
*A61L 9/02* (2006.01)

(52) U.S. Cl. ......... 349/58; 261/DIG. 88; 261/DIG. 89; 422/5

(58) Field of Classification Search .................. 349/58; 422/5; 261/DIG. 88, DIG. 89; *A61L 9/02*
See application file for complete search history.

(56) References Cited

U.S. PATENT DOCUMENTS

| 4,084,079 | A | * | 4/1978 | Costello | 392/392 |
| 4,754,271 | A | * | 6/1988 | Edwards | 345/98 |
| 5,744,819 | A | * | 4/1998 | Yamamoto et al. | 257/59 |
| 6,581,915 | B2 | * | 6/2003 | Bartsch et al. | 261/26 |
| 7,097,161 | B2 | * | 8/2006 | Liou | 261/30 |
| 7,219,725 | B2 | * | 5/2007 | Chisholm | 166/68 |
| 2002/0171785 | A1 | * | 11/2002 | Yen | 349/61 |
| 2003/0164557 | A1 | * | 9/2003 | Chung et al. | 261/26 |

FOREIGN PATENT DOCUMENTS

KR   2005017771 A  *  2/2005

* cited by examiner

*Primary Examiner*—David Nelms
*Assistant Examiner*—Matthew P Lawson
(74) *Attorney, Agent, or Firm*—Lowe Hauptman Ham & Berner, LLP

(57) ABSTRACT

A liquid crystal display (LCD) with a perfume dispenser is disclosed to include a casing, which has an internal chamber, a front opening, and at least one through hole, a liquid crystal display mounted inside the internal chamber of the casing with the display screen thereof facing to the front opening of the casing, and a perfume dispenser mounted inside the casing adjacent to the at least one through hole for giving off a pleasant smell upon operation of the LCD.

10 Claims, 5 Drawing Sheets

LIQUID CRYSTAL DISPLAY WITH A PERFUME DISPENSER

RELATED APPLICATION

The present application is based on, and claims priority from, Taiwanese Application Number 093220686, filed Dec. 22, 2004, the disclosure of which is hereby incorporated by reference herein in its entirety.

BACKGROUND OF THE INVENTION

1. Field of the Invention

The present invention relates to a liquid crystal display (LCD) and more particularly, to an LCD with a perfume dispenser, which gives off a pleasant smell during operation.

2. Description of Related Art

An LCD has a display screen for showing information for viewing by the user. For example, an LCD for a computer can be controlled to display input data inputted into the computer by the user or output data obtained from the computer after a computation. Further, an LCD-TV can show video program contents for viewing by the user.

However, a regular LCD is simply a display device for data output. Further, during the use of an LCD, the internal electronic devices will generate heat. Therefore, an LCD has vents for dissipation of heat.

Along with social change, people have different requirements for their daily lives. When choosing an electronic product, for example, an LCD, consumers may consider the added function. Therefore, it is important to create new technology products with added functions.

SUMMARY OF THE INVENTION

The present invention has been accomplished under the circumstances in view. It is therefore the main object of the present invention to provide an LCD with a perfume dispenser that gives off a pleasant smell during its operation. To achieve this and other objects of the present invention, the LCD with a perfume dispenser comprises a casing, a liquid crystal display, and a perfume dispenser. The casing comprises an internal chamber, a front opening, and at least one through hole. The liquid crystal display is mounted inside the internal chamber of the casing, and has a display screen facing to the front opening of the casing. The perfume dispenser is mounted inside the casing adjacent and to the at least one through hole. During operation of the LCD, the perfume dispenser gives off a pleasant smell.

Further, the at least one through hole comprises at least one vent in the casing. The casing comprises a front cover shell and a back cover shell. The front opening is formed in the front cover shell and at the center thereof. The at least one through hole is formed in the back cover shell. The perfume dispenser is mounted in between the liquid crystal display and the back cover shell. The perfume dispenser comprises an vessel mounted in the inner side of the back cover shell, the vessel has at least one perfume dispensing hole and a filling hole at the top side thereof.

Further, the liquid crystal display also comprises a heat generating electronic device, for example, an electric heater located adjacent to the perfume dispenser. The liquid crystal display further comprises a power supply circuit assembly. The electric heater is electrically connected to the power supply circuit assembly.

The LCD with a perfume dispenser further comprises an electric fan mounted in the internal chamber of the casing and is adjacent to the perfume dispenser, and is adapted to cause air flow through the perfume dispenser and the at least one through hole toward outside of the casing.

The perfume dispenser further comprises a reservoir containing an essential oil therein, and a holder retaining the reservoir. The casing can be made to have a foldaway part disposed corresponding to the at least one through hole for holding the perfume dispenser when opened. The foldaway part has lock means adapted to lock the foldaway part to the casing when closed.

DETAILED DESCRIPTION OF THE PREFERRED EMBODIMENT

Figure 1:
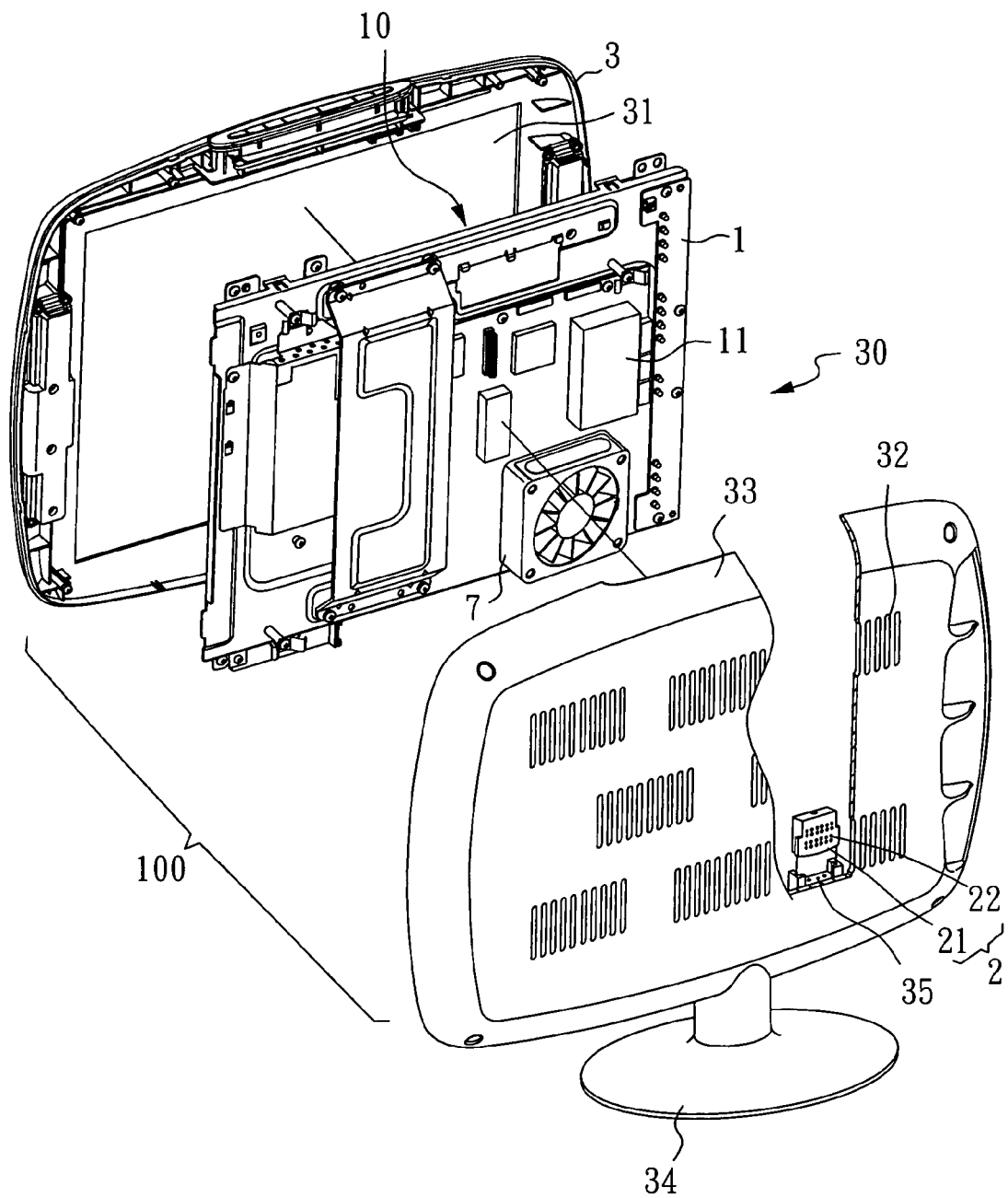
FIG. 1 is an exploded view of an LCD with a perfume dispenser according to a first embodiment of the present invention.
Figure 2:
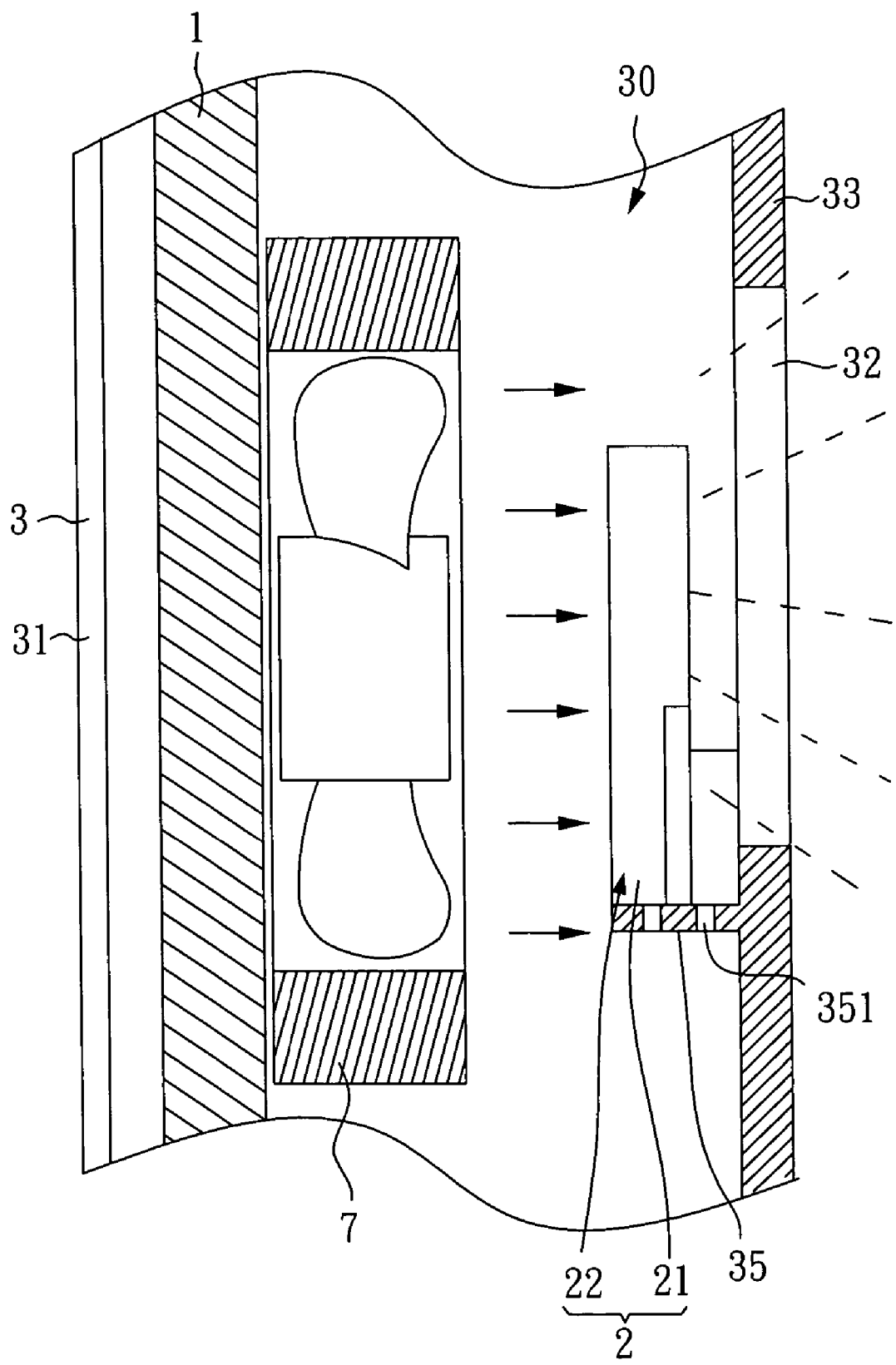
FIG. 2 is a sectional view in an enlarged scale of a part of the LCD with a perfume dispenser according to the first embodiment of the present invention.

Referring to FIG. 1 and FIG. 2, an LCD 100 in accordance with the first embodiment of the present invention is shown comprised of a front cover shell 3, a back cover shell 33, a liquid crystal display 1, a perfume dispenser 2, and a stand 34. The front cover shell 3, the back cover shell 33 and the stand 34 form the body of the LCD 100. The front cover shell 3 and the back cover shell 33 define therebetween an internal chamber 30. The front cover shell 3 has a front opening 31 defined around the center area thereof. The back cover shell 33 has a plurality of through holes 32. According to this embodiment, the through holes 32 are heat vents for dissipation of heat.

Further, according to this embodiment, the liquid crystal display 1 is used in an LCD-TV and mounted in the internal chamber 30. The liquid crystal display 1 comprises a display screen 10 facing to the front opening 31 of the front cover shell 3, and a heat generating electronic device 11. The heat generating electronic device 11 is an internal heat source. The through holes 32 are formed in the back cover shell 33 above the elevation of the heat generating electronic device 11 (internal heat source).

Further, as shown in FIG. 2, the perfume dispenser 2 is mounted in between the liquid crystal display 1 and the back cover shell 33 and below the through holes 32. According to this embodiment, the perfume dispenser 2 is mounted on the back cover shell 33, and comprises a reservoir 21, which contains an essential oil 22 therein. A holder 35 is provided inside the back cover shell 33 to retain the reservoir 21 of the perfume dispenser 2. The holder 35 has a plurality of bottom through holes 351. The essential oil 22 can be any of a variety of volatile perfumes or aromatics that give off a pleasant smell when heated to change into vapor. The essential oil 22 can be refurnished by means of the use of a syringe.

During operation of the LCD 100, the heat generating electronic device 11 (internal heat source) gives off heat to the perfume dispenser 2, causing the essential oil 22 to change into vapor, and therefore the pleasant smell of the essential oil 22 passes through the through holes 32 to the outside. Further, an electric fan 7 may be mounted inside the internal chamber 30 adjacent to the perfume dispenser 2, and is controlled to cause air flow through the perfume dispenser 2 and the through holes 32 to carry the pleasant smell of the essential oil 22 to the outside of the LCD 100.

As stated above, the heat energy produced by the heat generating electronic device 11 (internal heat source) during the operation of the LCD 100 causes the essential oil 22 to change into vapor, thereby giving a pleasant smell to the surroundings, i.e., the user smells a pleasant smell when watching the display data of the LCD 100. The pleasant smell relaxes the user's muscles and mind.

Figure 3:
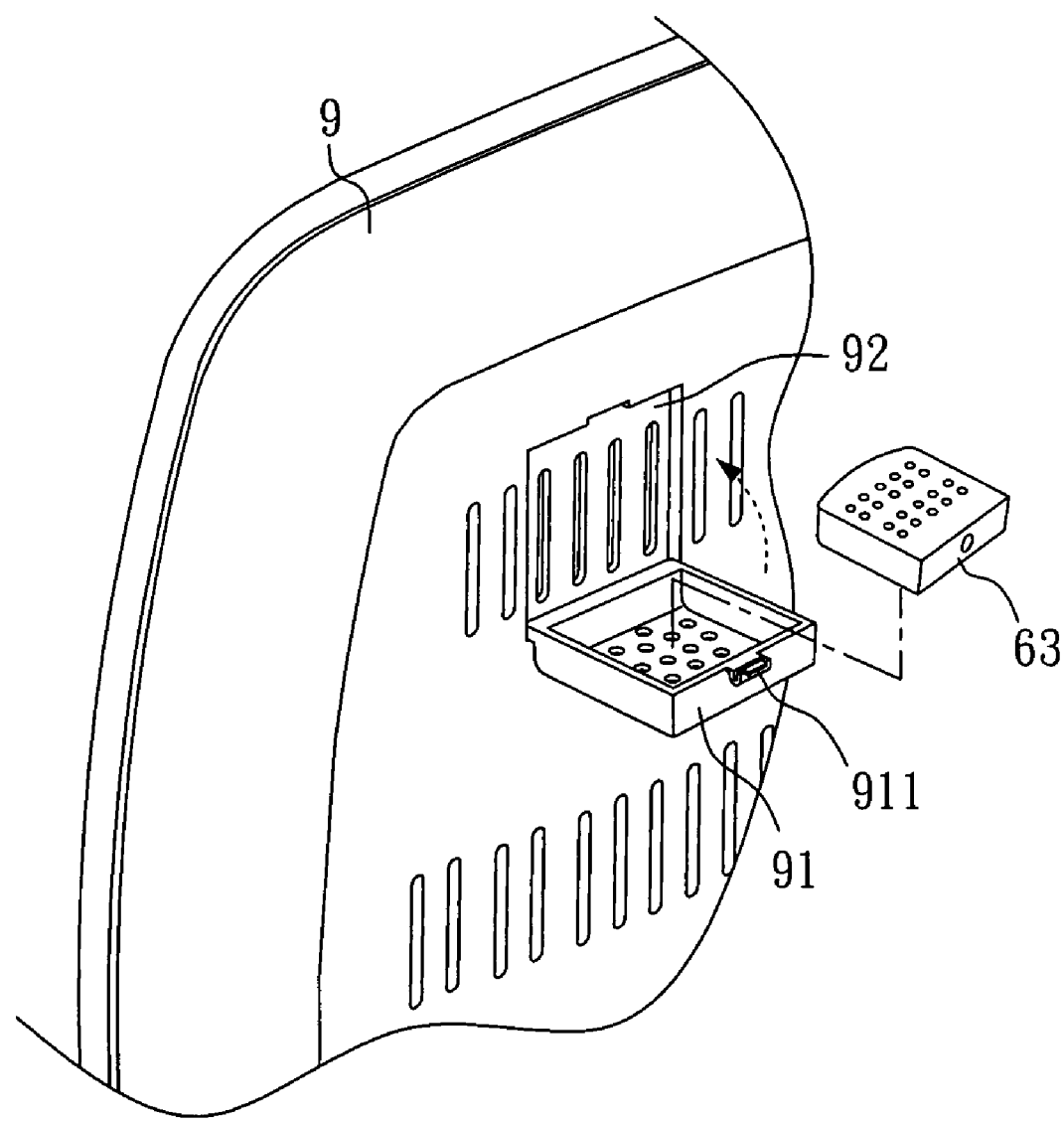
FIG. 3 is an exploded view of a part of an LCD with a perfume dispenser according to a second embodiment of the present invention.

FIG. 3 is an exploded view of a part of an LCD with a perfume dispenser according to the second embodiment of the present invention. This embodiment is substantially similar to the aforesaid first embodiment with the exception of the formation of a foldaway part 91 at the back cover shell 9. The back cover shell 9 has a recessed holder 92 at the back side. The foldaway part 91 is pivoted to the bottom side of the recessed holder 92 for holding a perfume dispenser 63 when opened. A retainer 911 is provided at the free end (top side) of the foldaway part 91 for securing the foldaway part 91 to the recessed holder 92 in the closed position.

Figure 4:
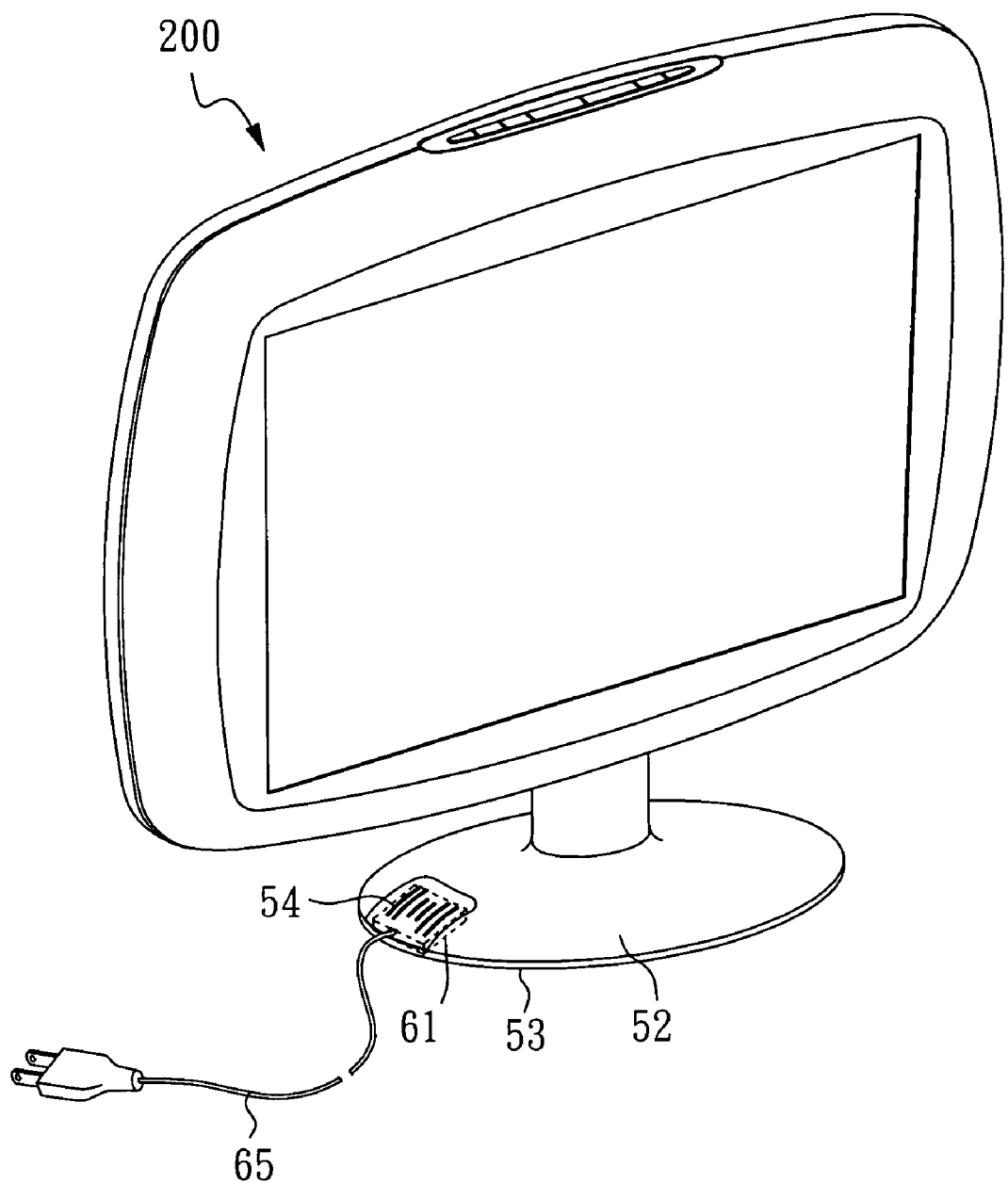
FIG. 4 is a perspective assembly view of an LCD with a perfume dispenser according to a third embodiment of the present invention.

FIG. 4 is a perspective assembly view of an LCD with a perfume dispenser according to the third embodiment of the present invention. According to this embodiment, the perfume dispenser 61 is installed in the stand 52 of the LCD 200. An electric heater 53 is installed in the stand 52 and electrically connected to the power circuit assembly 65 of the LCD 200. Further, the stand 52 has a plurality of through holes 54 defined above the perfume dispenser 61. After connection of the LCD 200 to a power supply and after the user has switched on the LCD 200, the electric heater 53 starts to generate heat, thereby causing the essential oil in the perfume dispenser 61 to change into vapor and to give off a pleasant smell that is carried with air passing out of the stand 52 through the through holes 54. Further, a manual switch may be installed for controlling electric connection of the electric heater 53 to the power circuit assembly 65 of the LCD 200.

Figure 5:
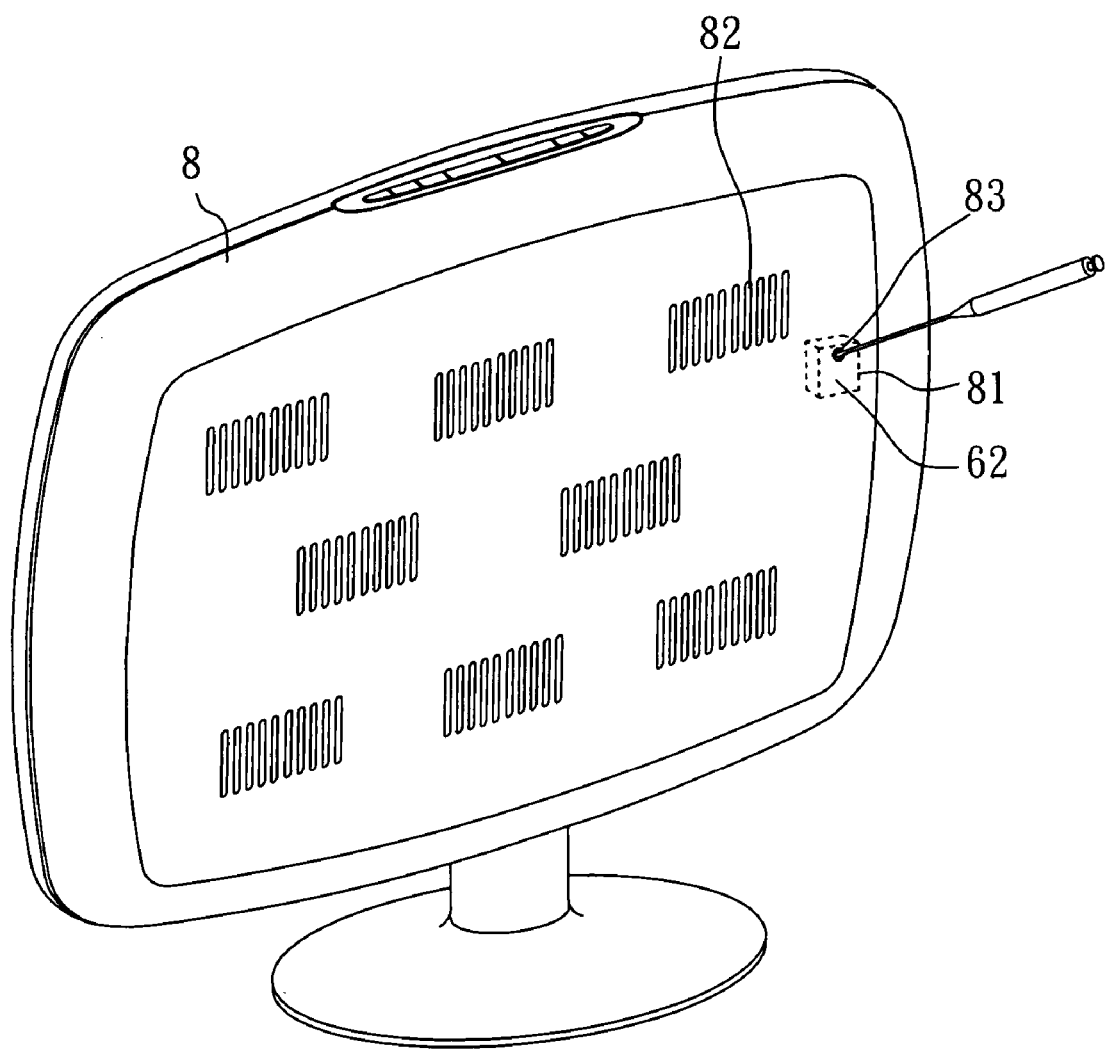
FIG. 5 is a perspective assembly view of an LCD with a perfume dispenser according to a fourth embodiment of the present invention.

FIG. 5 is a perspective assembly view of an LCD with a perfume dispenser according to the fourth embodiment of the present invention. According to this embodiment, an vessel 81 is formed in an inner side of the back cover shell 8 for accommodating a perfume dispenser 62. A filling hole 83 is formed in the back cover shell 8 and is in communication with the vessel 81 at the top. Through the filling hole 83, the user can fill an essential oil into the perfume dispenser 62 in the vessel 81. The back cover shell 8 further has a plurality of through holes 82 above the vessel 81. This embodiment achieves the same effect of the aforesaid first embodiment of the present invention.

Although the present invention has been explained in relation to its preferred embodiments, it is to be understood that many other possible modifications and variations can be made without departing from the spirit and scope of the invention as hereinafter claimed.

What is claimed is:

1. A liquid crystal display with a perfume dispenser comprising:
   a casing, said casing comprises an internal chamber, a front opening, at least one through hole, a front cover shell and a back cover shell, said front opening is formed in said front cover shell at the center thereof, said at least one through hole is formed in said back cover shell and comprises at least one heat dispersion hole;
   a liquid crystal display mounted inside said internal chamber of said casing, said liquid crystal display having a display panel facing to said front opening of said casing; and
   a perfume dispenser mounted on said casing and adjacent to said at least one through hole, said perfume dispenser is mounted in between said liquid crystal display and said back cover shell.

2. The liquid crystal display with a perfume dispenser as in claim 1, wherein said perfume dispenser comprises a vessel mounted in an inner side of said back cover shell, said vessel having at least one perfume dispensing hole and a filling hole at a top side thereof.

3. The liquid crystal display with a perfume dispenser as in claim 1, wherein said liquid crystal display further comprises a heat generating electronic device located adjacent to said perfume dispenser.

4. The liquid crystal display with a perfume dispenser as in claim 3, wherein said heat generating electronic device is an electric heater.

5. The liquid crystal display with a perfume dispenser as in claim 4, wherein said liquid crystal display further comprises a power supply circuit assembly; said electric heater is electrically connected to said power supply circuit assembly.

6. The liquid crystal display with a perfume dispenser as in claim 1, further comprising an electric fan mounted in said internal chamber of said casing adjacent to said perfume dispenser, and adapted to cause air flow through said perfume dispenser and said at least one through hole toward outside of said casing.

7. The liquid crystal display with a perfume dispenser as in claim 1, wherein said casing further comprises a stand.

8. The liquid crystal display with a perfume dispenser as in claim 1, wherein said perfume dispenser comprises a reservoir containing an essential oil therein, and a holder holding said reservoir.

9. The liquid crystal display with a perfume dispenser as in claim 1, wherein said casing comprises a foldaway part disposed corresponding to said at least one through hole for holding said perfume dispenser when opened, said foldaway part having lock means adapted to lock said foldaway part to said casing when closed.

10. A liquid crystal display with a perfume dispenser comprising:
    a casing, said casing comprises an internal chamber, a front opening, at least one through hole, a front cover shell, a back cover shell and a stand, said front opening is formed in said front cover shell at the center thereof, said at least one through hole is formed in said stand;
    a liquid crystal display mounted inside said internal chamber of said casing, said liquid crystal display having a display panel facing to said front opening of said casing; and
    a perfume dispenser mounted in said stand and adjacent to said at least one through hole.

* * * * *